United States Patent [19]
Everitt et al.

[11] Patent Number: 5,534,863
[45] Date of Patent: Jul. 9, 1996

[54] LOW RESOLUTION, HIGH LINEARITY DIGITAL-TO-ANALOG CONVERTER WITHOUT TRIM

[75] Inventors: James W. Everitt, Grass Valley; Hiroshi Takatori, Sacramento, both of Calif.

[73] Assignee: Level One Communications, Inc., Sacramento, Calif.

[21] Appl. No.: 177,925

[22] Filed: Jan. 6, 1994

[51] Int. Cl.[6] ............................................. H03M 1/66
[52] U.S. Cl. ........................................ 341/150; 341/144
[58] Field of Search ................................. 341/144, 150, 341/153

[56] References Cited

U.S. PATENT DOCUMENTS

| | | | |
|---|---|---|---|
| 4,125,803 | 11/1978 | Van De Plassche | 330/254 |
| 4,622,536 | 11/1986 | Shih et al. | 341/150 |
| 4,857,929 | 8/1989 | Katzenstein | 341/148 |
| 4,872,011 | 10/1989 | Pelgrom et al. | 341/150 |
| 4,875,046 | 10/1989 | Lewyn | 341/148 |
| 4,899,153 | 2/1990 | Lewyn | 341/156 |
| 4,928,102 | 5/1990 | Katzenstein | 341/154 |
| 4,988,900 | 1/1991 | Fensch | 307/494 |
| 5,021,681 | 6/1991 | Colbeck et al. | 307/261 |
| 5,243,346 | 9/1993 | Inami | 341/144 |

FOREIGN PATENT DOCUMENTS 3801774 7/1989 Germany .
2080059 1/1982 United Kingdom .

OTHER PUBLICATIONS

Peter J. A. Naus, Eise C. Dijkmans, Eduard F. Stikvoort, Andrew J. McKnight, David J. Holland, and Werner Bradinal, "A CMOS Stereo 16-bit D/A Converter for Digital Audio," *IEEE J. Solid–State Circuits*, vol. SC–22, Jun. '87, pp. 486–490.

"CSZ5316: 16-Bit, 20 kHz Oversampling A/D Converter" data sheets, Crystal Semiconductor Corporation, Aug. 1987, 7 pp.

*Primary Examiner*—Marc S. Hoff
*Attorney, Agent, or Firm*—Merchant, Gould, Smith, Edell, Welter & Schmidt

[57] ABSTRACT

A digital-to-analog (D/A) converter eliminates matching requirements and does not generate harmonics or noise. The D/A converter has an array of injectors for converting an input word to an analog voltage. A plurality of clocked switches discharge the injector array and the feedback path when switched into a first phase position and transfer the injector signal across the feedback path to the output of the D/A converter when switched to a second phase position. The conversion period, the time in which the digital input word is converted to an analog output voltage, is divided into N–1 subperiods. Each injector is enabled once or not at all for each subperiod such that the weighted signal injected during a single conversion period is constant and such that all the injectors in the array contribute an equal amount of signal during a conversion period.

19 Claims, 6 Drawing Sheets

LOW RESOLUTION, HIGH LINEARITY DIGITAL-TO-ANALOG CONVERTER WITHOUT TRIM

BACKGROUND OF THE INVENTION

1. Field of the Invention

This invention relates in general to a high linearity, low resolution digital-to-analog (D/A) converter.

2. Description of Related Art

Even though most information, such as sound, temperature, voltage and current, is analog, such information is typically converted into digital representations for manipulation. The reason for the proliferation of digital electronics is found in the fact that analog signals are difficult to manipulate. On the other hand, digital signals can be controlled by simple logic circuits or by microprocessors. Further, the speed and accuracy with which digital signals can be manipulated has led to the advances in telecommunications and computing we are accustomed to today.

Digital-to-analog (D/A) converters (also called DACs) are used to present the results of digital computation, storage, or transmission for graphical displays or for the control of devices that operate with continuously varying quantities. D/A converters are also used in the design of analog-to-digital converters that employ feedback techniques, such as successive-approximation and counter-comparator types. Thus, D/A converters provide the interface between the digital and analog components.

A D/A converter accepts a digital signal in the form of an N-bit parallel data word and converts it to an equivalent analog representation. Several methods have been developed over the years to deal with D/A conversion. Two generally accepted methods are the binary-weighted and binary ladder D/A.

The binary-weighted technique is the oldest and simplest method of converting digital bits into an analog signal. A binary word is applied to a series of gates that drive analog switches which apply weighted-signals to the input of an operational amplifier. The value of the input and feedback resistors are carefully chosen to create a binary progression. Each switch can be closed in combination to generate a predetermined analog output. Since the resistors values range from a very high value for the least significant bit to a very low value for the most significant bit, the binary-weighted method is not practical for applications requiring more than 4 bits of resolution. Thus, the ladder-network technique was developed.

The ladder-network technique is capable of producing binary weighted voltages with only two values of resistance arranged in a type of voltage-divider network known as a binary ladder. The primary advantage of the binary ladder design is its use of only two resistor values.

However, the components providing the input to D/A converters must be matched so that the linearity of the D/A converter and the number of bits provided by the input component are the same. When the linearity requirements of D/A converters exceeds the accuracy to which components can be matched, either the requirements for component matching must be eliminated or matching inaccuracies must be adaptively compensated.

Previously, sigma-delta converters have been used to eliminate matching requirements. In sigma-delta converters, a feedback word is compared to the input word. If the feedback word is greater than the input word, then a unit is subtracted from the feedback word. If the feedback word is less than the input word, then a unit is added to the feedback word. However, the sigma-delta converter has the disadvantage of slow conversion rate and requires filtering to eliminate undesirable noise and/or harmonics generated by the converter.

Pulse width modulation converters have also been used to eliminate the need for component matching. The converter transforms the input word into an analog signal within a predetermined period of time. This period is referred to the conversion period. In a pulse width modulation converter for an N state input word, the conversion period is divided into N−1 subperiods. The converter injects M units to a summer in M of the N−1 subperiods, where M is proportional to the value of the input word being converted.

For N states where the conversion period is subdivided into N−1 subperiods, the injector contributes either 0 or 1 units per subperiod. For a 2 bit word, the number of states is $N=2^2=4$ and $T_n=$ Nth time subperiod as indicated in the Table below:

| T1 | T2 | T3 | STATE |
|----|----|----|-------|
| 0  | 0  | 0  | 0     |
| 0  | 0  | 1  | 1     |
| 0  | 1  | 1  | 2     |
| 1  | 1  | 1  | 3     |

This converter has the desirable characteristic that there is only 1 injector which injects multiple times as a function of the input word being converted, and, therefore, does not have the problem of matching multiple components. However, as can be seen from the chart, the amount of signal injected during a single conversion period is not constant, i.e., it can be either 1 or 0 for any given subperiod of the conversion period. This means that the converter creates undesirable noise which must be filtered out if the application is sensitive to such noise.

Reference is made to FIG. 1 which depicts a highly linear pulse generator 2 which emphasizes the need for a high linearity, low resolution converter. The pulse generator implements a ±1 and ±3 level generator (referred to as 2B1Q generator, i.e. 2 bit to 1 quat generator). If the larger capacitor 4 (C3) is not exactly equal to 3 times the value of the smaller capacitor 6 (C1), then the ±3 pulses are not exactly equal to 3 times the ±1 pulses. Conventional CMOS processes have capacitor matching on the order of one percent (1%). Therefore, the linearity of a pulse generator 2 as illustrated in FIG. 1 is limited to the capacitor matching of one percent, which results in 40 decibel (dB) linearity.

Thus, it can seen then that there is a need for a D/A converter that will provide high linearity without the problems associated with matching capacitor values.

SUMMARY OF THE INVENTION

To overcome the limitations in the prior art described above, and to overcome other limitations that will become apparent upon reading and understanding the present specification, the present invention discloses a low resolution, high linearity D/A converter. The present invention solves the above-described problems of linearity by using a novel apparatus and method of eliminating matching requirements without incurring the disadvantages of more conventional matching insensitive converters.

The resolution of a D/A converter is a measure of the change in the analog output for a change of one least significant bit in the digital input and is a function of the number of discrete digital states that are used to express the analog signal. Normally, a high linearity D/A converter has a resolution on the same order of the linearity, i.e., a converter that requires 12 bits of linearity will usually generate an output of 12 to 13 bits.

The present invention provides a D/A converter that can be used when the accuracy to which components can be matched does not meet the linearity requirements of typical D/A converters. A system in accordance with the principles of the present invention comprises an injector array for providing charges, derived from weighted-current or weighted-voltage, to the input of a summing input port of an operational amplifier. The injectors in the present invention comprise capacitors which are alternately charged and discharged. The injection of the signal to the operational amplifier is controlled by switches driven by the bits of the parallel word.

One aspect of the present invention is that the amount of signal injected into the input port of the operational amplifier during a single conversion period remains constant.

Another aspect of the present invention is that the conversion period is broken into subperiods having equal magnitudes.

These and various other advantages and features of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described specific examples of systems and methods in accordance with the invention.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Figure 1:
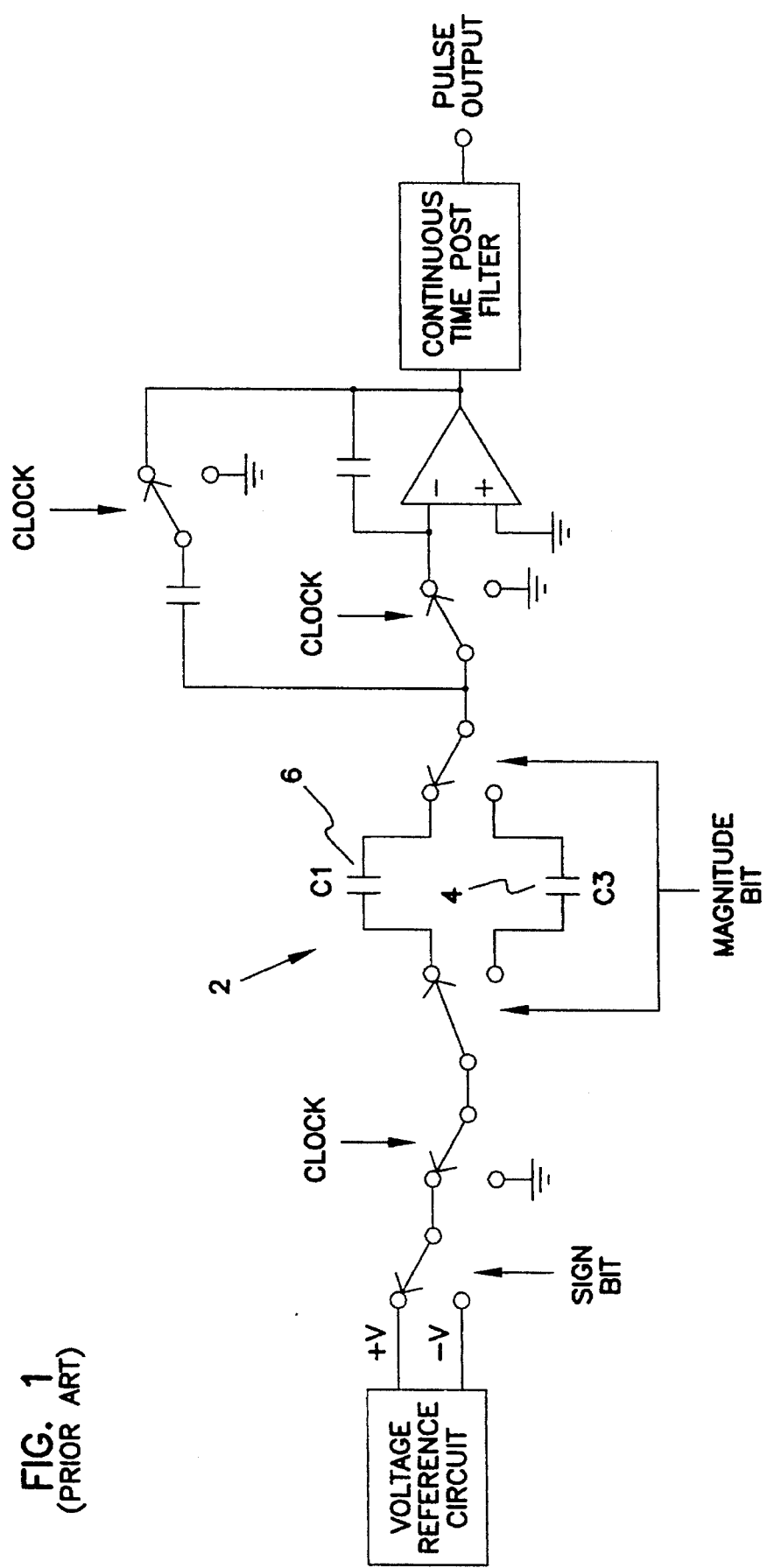
FIG. 1 is a prior art block diagram of a highly linear pulse generator.
Figure 2A:
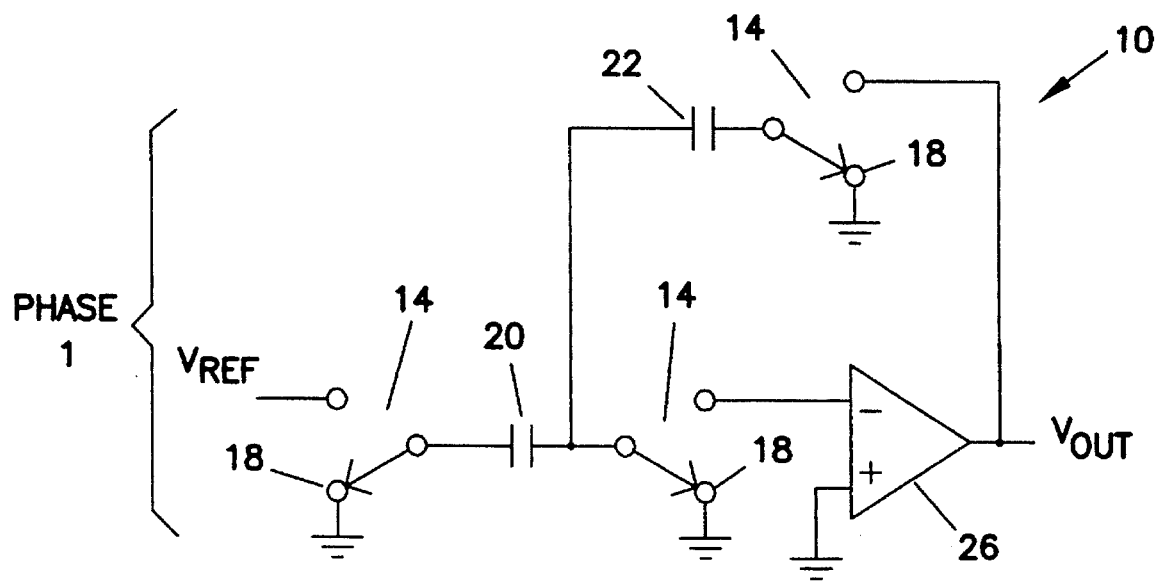
FIG. 2A is a circuit diagram of a prior art switched capacitor circuit demonstrating the clock switches discharging the input and feedback capacitors.
Figure 2B:
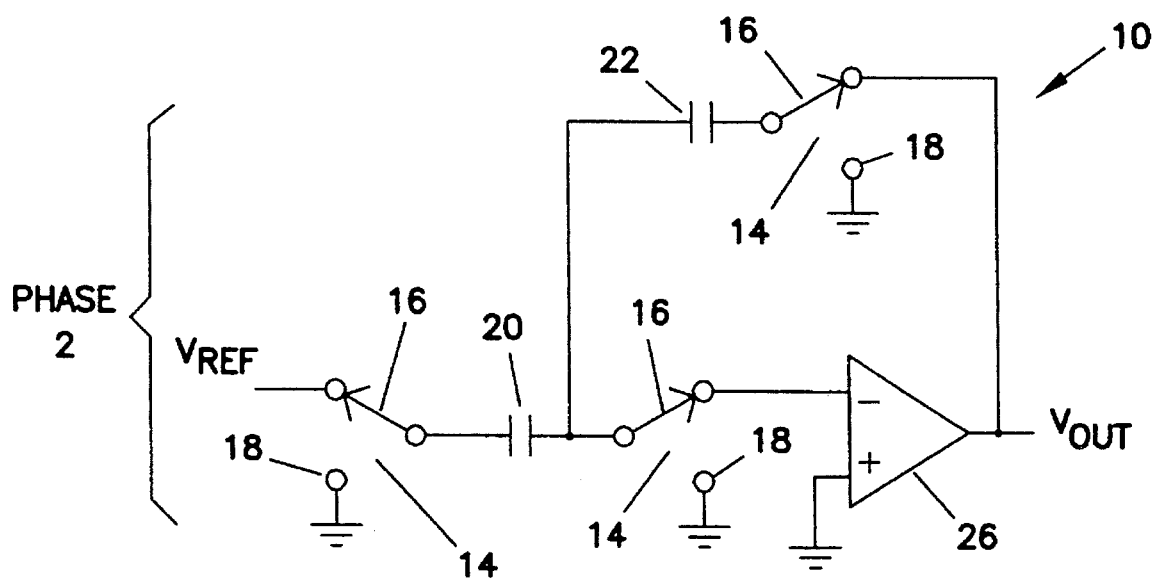
FIG. 2B is a circuit diagram of a prior art switched capacitor circuit demonstrating the clock switches transferring the charge on the input capacitor to the feedback capacitor.

Referring now to FIGS. 2A and 2B, conventional switched capacitor circuits 10 are shown. FIG. 2A illustrates phase one where a clock pulse controlling clocked switches 14 drives the armatures 16 to the poles 18 connected to ground in unison so that the input capacitor 20 and the feedback capacitor 22 are discharged. During phase two, as illustrated in FIG. 2B, the operational amplifier 26 forces the charge on the input capacitor 20 to be transferred to the feedback capacitor 22.

The clocked switches 14 shown are single-pole, two throw models and may be of the type which are configured to normally be in a closed position unless enabled by a logic pulse. However, any type of switch capable of toggling between a first and a second position could be used without departing from the invention.

The output voltage $V_{out}$ is determined from the equation:

$$V_{out} = -V_{ref}\frac{C_1}{C_2}$$

wherein $C_1$ is the capacitance of the input capacitor and $C_2$ is the capacitance of the feedback capacitor.

Figure 3:
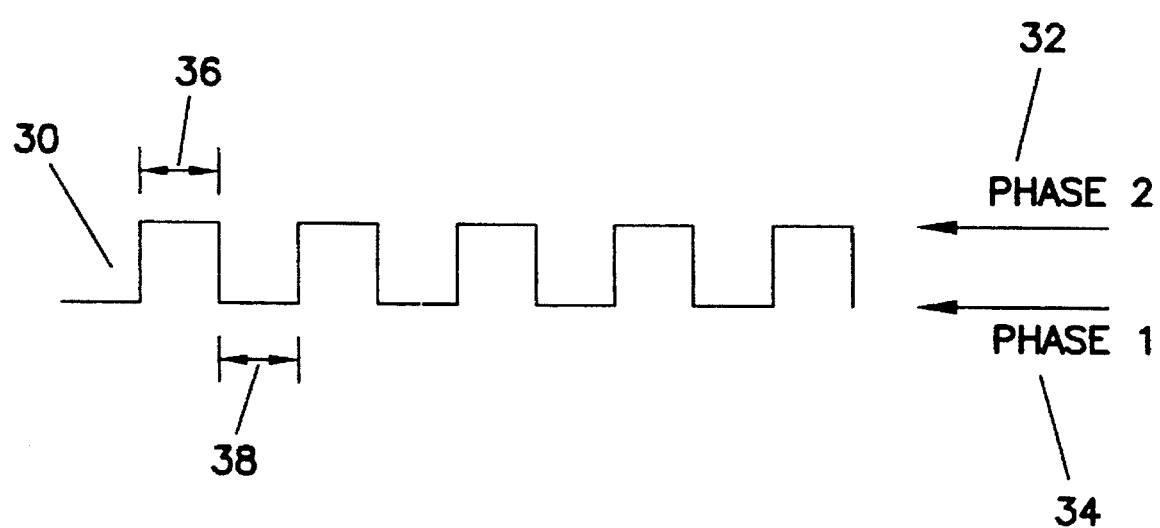
FIG. 3 is the switch controlling waveform (clock) of the prior art switched capacitor circuit of FIGS. 2A and 2B.

The clocked switches 14 illustrated in FIGS. 2A and 2B are controlled by the clock pulse 30 illustrated in FIG. 3. The clocked switches 14 are toggled in unison between the two poles in response to the clock pulse-train 30. For illustration purposes only, phase two 32, as illustrated in FIG. 2A, occurs when the logic gate of the clocked switches 14 encounters the leading edge of the positive pulse in FIG. 3. Phase two 32 defines the transfer phase where charges are transferred to the output of the amplifier. The transfer phase period is equal to the pulse width 36 of the clock pulse-train 30. Phase one 34, as illustrated in FIG. 2B, occurs when the bottom edge of the pulse 30 is encountered. Phase one 34 defines the discharge phase where the injectors are grounded thereby discharging the capacitors. The discharge phase period is equal to the time between the clock pulses 38.

Figure 4:
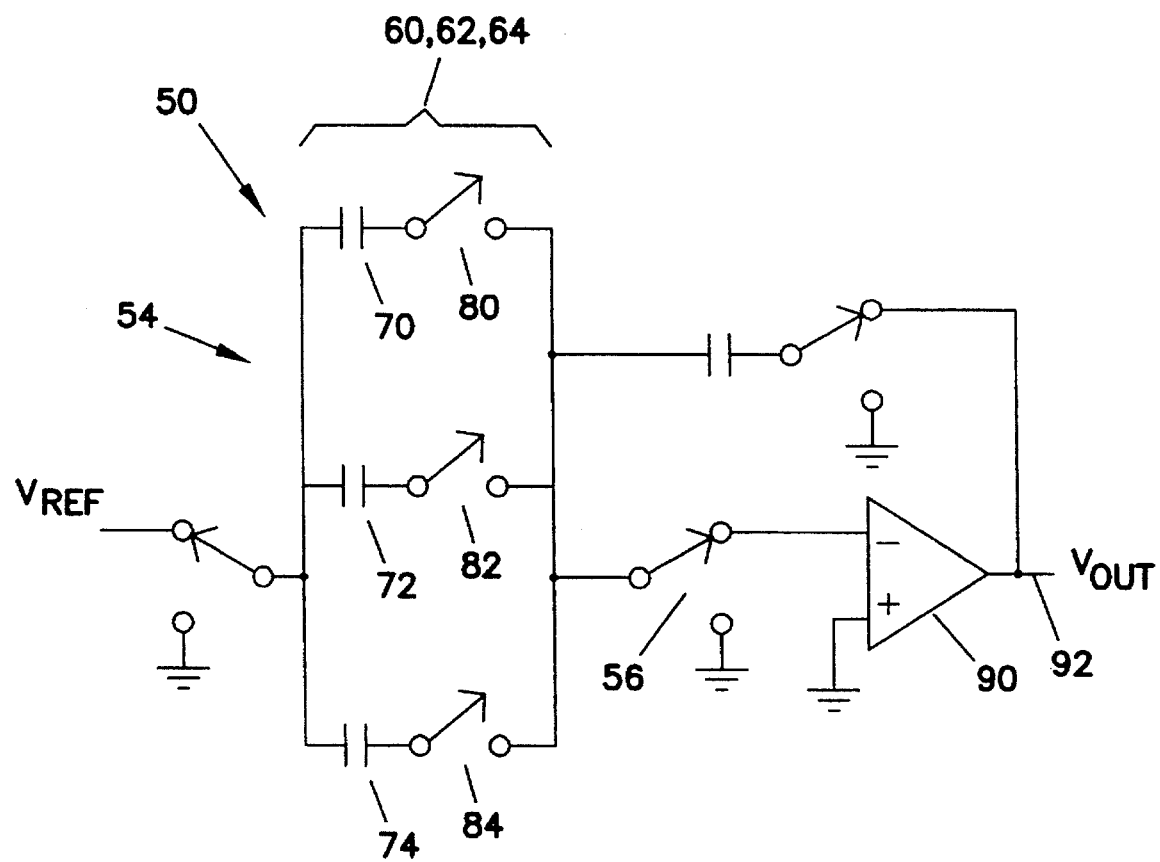
FIG. 4 is a circuit diagram of an embodiment of the present invention.

A modification to this conventional switched capacitor circuit is used to demonstrate one hardware implementation of the present invention for a 4 state word as illustrated in FIG. 4. For an N state input word, the D/A converter 50 of the present invention comprises an array 54 of N−1 injectors 60, 62, 64, each injecting some quantity or weighted signal, such as charge, into a summer node 56. In the illustrated embodiment, the D/A converter consists of 3 switched injector capacitors 70, 72, 74 injecting charge into a summer node 56. Injector switches 80, 82, 84 in combination with the three injector capacitors 70, 72, 74 implement the 3 injectors 60, 62, 64 of FIG. 4.

For a 2 bit word, the number of states is $N=2^2=4$. Thus, the value injected by each injector 60, 62, 64 during each conversion subperiod for each of the four states as indicated in the Table below:

| INJ. | T1 | T2 | T3 | STATE | INJ. | T1 | T2 | T3 | STATE |
|------|----|----|----|-------|------|----|----|----|-------|
| I1 | 0 | 0 | 0 | 0 | I1 | 1 | 1 | 0 | 2 |
| I2 | 0 | 0 | 0 |   | I2 | 0 | 1 | 1 |   |
| I3 | 0 | 0 | 0 |   | I3 | 1 | 0 | 1 |   |
| I1 | 1 | 0 | 0 | 1 | I1 | 1 | 1 | 1 | 3 |
| I2 | 0 | 1 | 0 |   | I2 | 1 | 1 | 1 |   |
| I3 | 0 | 0 | 1 |   | I3 | 1 | 1 | 1 |   |

The period for converting a digital input word to an analog voltage is divided into N−1 subperiods with each injector 60, 62, 64 contributing per subperiod a weighted signal which may be either no charge (0) or one unit of charge (1). The unit of charge may be either positive or negative, depending upon the design of the circuit. Each subperiod comprises one cycle of a clock pulse 30 or a phase one 34, phase two 32 combination. Thus, for each subperiod, the injectors 60, 62, 64 transfer a charge to the input of the amplifier 90 which is thereby seen at the output 92 of the amplifier 90. For the entire conversion period each injector 60, 62, 64 injects K equal units into the summer node, where K represents the value of the state and 0<K<N−1.

Injector switches 80, 82, 84 in FIG. 4 determine whether injector capacitors 70, 72, or 74 respectively injects charge during a given subperiod. As defined in the chart above, the injector switches 80, 82, 84 are closed if represented by a one in the appropriate subperiod column.

As can be seen from the chart, linearity is unaffected by mismatches in the injectors and undesired harmonics are suppressed since all subperiods of the sample conversion period are of approximately equal amplitude, i.e., I1+I2+I3 for T1=I1+I2+I3 for T2=I1+I2+I3 for T3.

Figure 5:
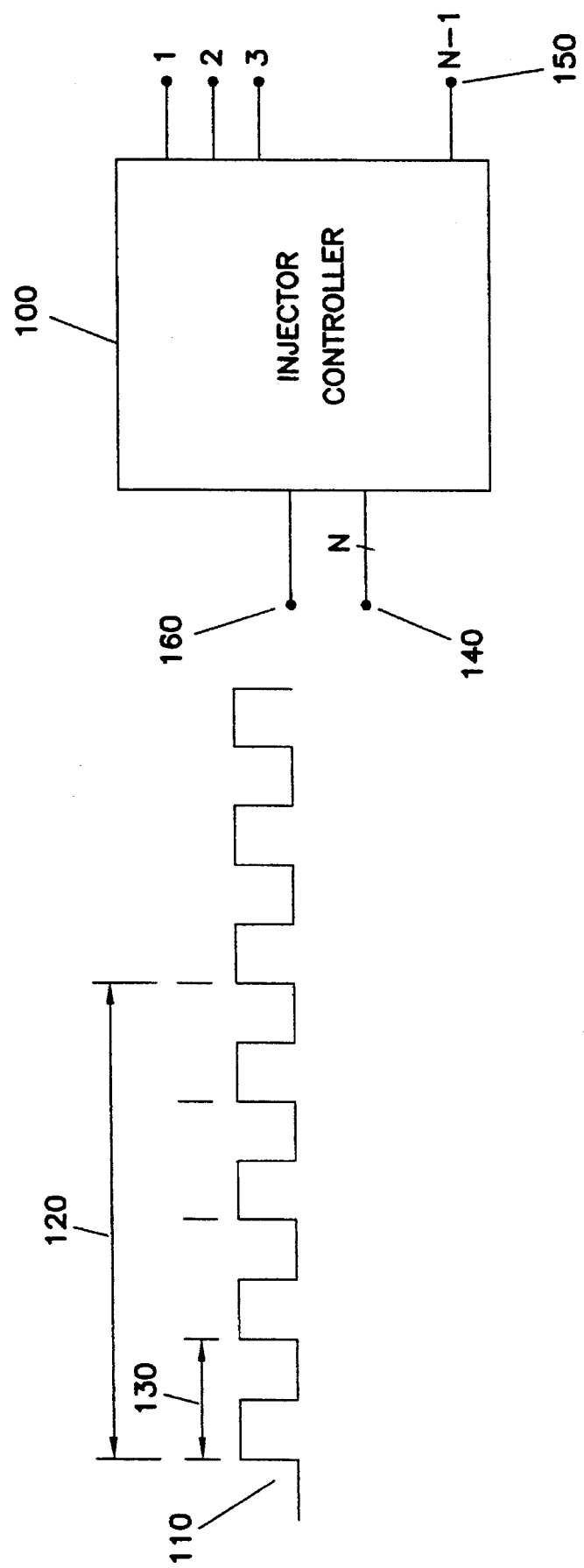
FIG. 5 is a block diagram of the injector switch trigger mechanism of the present invention.

FIG. 5 illustrates an injector switch controller 100 in accordance with the present invention. The injector controller 100 accepts a clock signal 110 at one input 160 and an N bit wide input data word at another input 140. A conversion period 120 is derived from the clock signal 110 and is divided into N−1 subperiods 130. In the present example of the invention, each conversion period 120 is divided into three (N−1) subperiods 130. Each individual injector 80, 82, 84 (shown in FIG. 4.) is activated by N−1 injector switch control signal outputs 150 from the injector switch controller 100.

Figure 6:
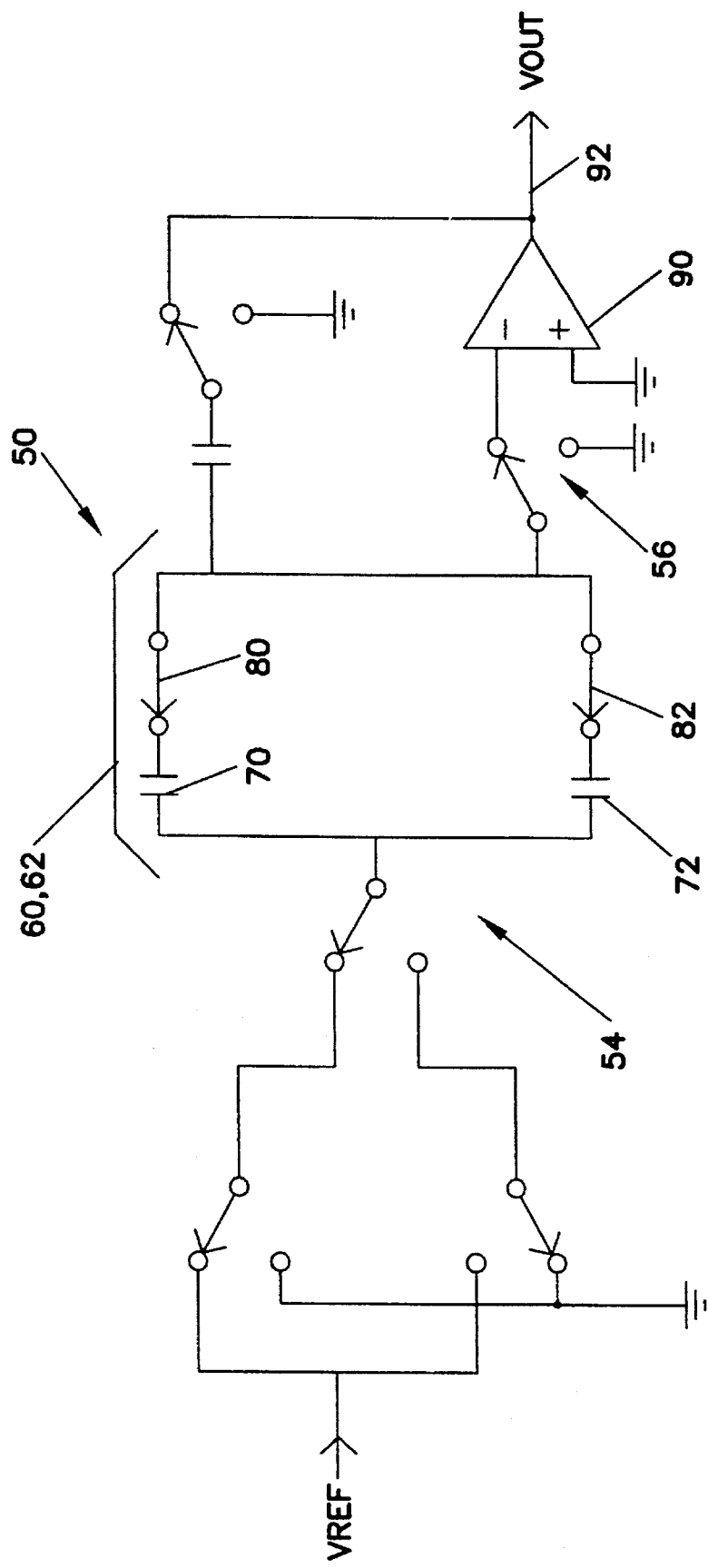
FIG. 6 is a circuit diagram of an alternative embodiment of the present invention implementing positive and negative charges.

Another implementation of the invention is illustrated in FIG. 6 which allows a single element to inject a positive (+) or a negative (−) charge without compromising matching. The period for converting a digital N state word to a proportional analog voltage is divided into (N−1)/2 subperiods with (N−1)/2 injectors. This modified version of the above scheme is implemented with injectors contributing a negative charge, no charge, or a positive charge per subperiod, i.e. −1, 0, or 1 units respectively. The injectors implement a 5 state word as indicated in the Table below:

| INJ. | T1 | T2 | STATE | INJ. | T1 | T2 | STATE |
|------|----|----|-------|------|----|----|-------|
| I1 | −1 | −1 | 0 | I1 | 1 | 0 | 3 |
| I2 | −1 | −1 |   | I2 | 0 | 1 |   |
| I1 | −1 | 0 | 1 | I1 | 1 | 1 | 4 |
| I2 | 0 | −1 |   | I2 | 1 | 1 |   |
| I1 | 0 | 0 | 2 |   |   |   |   |
| I2 | 0 | 0 |   |   |   |   |   |

Other versions are possible without departing from the scope of the present invention.

In summary, the converter disclosed in accordance with the present invention adds the contribution of each injector for each subperiod, which may be a voltage, current or charge. For each subperiod of the input word conversion period, the sum of the voltages/charges from the injectors are of equal magnitude. This eliminates the noise generation problem of the conventional converter. Additionally, over the complete conversion period each injector contributes an equal number of unit voltages/charges. This eliminates the need to actively compensate for mismatches.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What we claim is:

1. A digital-to-analog converter for converting an N state digital input word to an analog equivalent, N being a positive integer, comprising:

(a) an amplifier having an input and an output, the amplifier having a feedback path connecting the output to the input;

(b) an array of injectors connected to the input of the amplifier for generating weighted-signals, the weighted-signals being injected into the input of the amplifier when the injectors are triggered; and (c) means for selectively providing a trigger to each injector and for determining a conversion period for converting the digital word to an analog voltage, the conversion period being divided into a plurality of subperiods and each injector capable of being triggered only once during each subperiod such that the amount of the signal injected during a single conversion period is constant, each injector in the array being triggered an equal number of times during a conversion period.

2. A digital-to-analog converter in accordance with claim 1, wherein the subperiod comprises a first phase where the injectors are discharged and a second phase where the weighted-signal is transferred to the output of the amplifier.

3. A digital-to-analog converter in accordance with claim 1, wherein the weighted signal comprises either 0 or +1 units of charge, wherein for the N state input word the array of injectors comprises N−1 injectors, each injector injecting 0 or +1 units per subperiod, and wherein the conversion period comprising N−1 subperiods.

4. A digital-to-analog converter in accordance with claim 3, wherein each path in the array of injectors comprises a capacitor and a switch in series, the switch being enabled in response to a control bit of the input word.

5. A digital-to-analog converter in accordance with claim 1, wherein the weighted signal comprises either −1, 0 or +1 units of charge, wherein for the N state input word the array of injectors comprises (N−1)/2 injectors, each injector injecting −1, 0 or +1 units per subperiod, and wherein the conversion period comprises (N−1)/2 subperiods.

6. A digital-to-analog converter in accordance with claim 1, wherein the conversion period comprises N−1 subperiods.

7. A digital-to-analog converter in accordance with claim 1, wherein the feedback path comprises a capacitor.

8. A digital-to-analog converter for an N state input word, N being a positive integer, comprising:

(a) an amplifier having an output port and an input port;

(b) an array of injectors connected to the input of the amplifier for generating weighted signals, the weighted signals being injected into the input of the amplifier when the injectors are triggered;

(c) a feedback path connecting the output port of the amplifier to the input port;

(d) a plurality of clocked switches for discharging the injector array and the feedback path when switched into a first phase position and for transferring the signals from the injectors to the output port of the operational amplifier when switched to a second phase position; and (e) means for selectively providing a trigger to each injector and for determining a conversion period for converting the digital word to an analog voltage, the conversion period being divided into a plurality of subperiods and each injector capable of being triggered only once during each subperiod such that the amount of the signal injected during a single conversion period is constant, each injector in the array being triggered an equal number of times during a conversion period.

9. A digital-to-analog converter in accordance with claim 8, wherein each subperiod comprises a sum of the transfer phase period and the discharge phase period.

10. A digital-to-analog converter in accordance with claim 8, wherein each injector path comprises a capacitor and a switch in series, the switch being triggered in response to a bit of the input word.

11. The digital to analog converter in accordance with claim 8, wherein the weighted signals comprise either 0 or +1 units of charge, wherein for the N state input word the array of injectors comprises N−1 injectors, each injector injecting 0 or +1 units per subperiod, and wherein the conversion period comprising N−1 subperiods.

12. A digital-to-analog converter in accordance with claim 8, wherein the conversion period comprises N−1 subperiods.

13. A digital-to-analog converter in accordance with claim 8, wherein the weighted signal comprises either −1, 0 or +1 units of charge, wherein for the N state input word the array of injectors comprises (N−1)/2 injectors, each injector injecting −1, 0 or +1 units per subperiod, and wherein the conversion period comprises (N−1)/2 subperiods.

14. A digital-to-analog converter for an N state input word, N being a positive integer, comprising:

(a) an operational amplifier having an inverting input port, a non-inverting input port and an output port, the non-inverting input port being connected to ground;

(b) a first clock switch having an armature which switches between a plurality of poles, a first pole being connected to a reference voltage source and a second pole connected to ground;

(c) a second clock switch having an armature which switches between a plurality of poles, a first pole connected to the input port of the operational amplifier, a second pole connected to ground;

(d) an injector array comprising a plurality of paths, each path comprising a capacitor connected at a first end to an injector switch, the injector switch connecting the capacitor to the armature of the second clock switch, the second end of the capacitor connected to the armature of the first clock switch;

(e) a feedback loop, comprising a third clock switch having an armature switching between a plurality of poles, a first pole of the third clock switch connected to the output of the amplifier, a second pole of the third clock switch connected to ground, the third switch armature connected to a first end of a feedback capacitor, and a second end of the feedback capacitor connected to the armature of the second clock switch;

(f) means for providing a signal to the clocked switches, the signal toggling the clock switches between the first poles and the second poles in unison; and (g) means for selectively providing a trigger to each injector switch and for determining a conversion period for converting the digital word to an analog voltage, the conversion period being divided into a plurality of subperiods and each injector switch capable of being triggered only once during each subperiod such that the amount of the signal injected during a single conversion period is constant, each injector in the array being triggered an equal number of times during a conversion period.

15. The digital-to-analog converter in accordance with claim 14, wherein the weighted signal comprises either 0 or +1 units of charge, wherein for the N state input word the array of injectors comprises N−1 injectors, each injector injecting 0 or +1 units per subperiod, and wherein the conversion period comprising N−1 subperiods.

16. A digital-to-analog converter in accordance with claim 14, wherein the conversion period comprises N−1 subperiods.

17. A digital-to-analog converter in accordance with claim 14, wherein the amount of signal injected comprises either −1, 0 or +1 units of charge, wherein for the N state input word the array of injectors comprises (N−1)/2 injectors, each injector injecting −1, 0 or +1 units per subperiod, and wherein the conversion period comprises (N−1)/2 subperiods.

18. The digital-to-analog converter in accordance with claim 14, wherein the injectors provide weighted-current to the input of the amplifier.

19. The digital-to-analog converter in accordance with claim 14, wherein the injectors provide weighted-voltage to the input of the amplifier.

* * * * *